US009812200B2

(12) United States Patent
Intrater et al.

(10) Patent No.: US 9,812,200 B2
(45) Date of Patent: Nov. 7, 2017

(54) CONCURRENT READ AND WRITE OPERATIONS IN A SERIAL FLASH DEVICE

(71) Applicant: Adesto Technologies Corporation, Sunnyvale, CA (US)

(72) Inventors: Gideon Intrater, Sunnyvale, CA (US); Bard Pedersen, Fremont, CA (US); Shane Hollmer, Grass Valley, CA (US); Derric Lewis, Sunnyvale, CA (US); Stephen Trinh, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 14/719,814

(22) Filed: May 22, 2015

(65) Prior Publication Data

US 2016/0012891 A1  Jan. 14, 2016

Related U.S. Application Data

(60) Provisional application No. 62/021,840, filed on Jul. 8, 2014.

(51) Int. Cl.
*G11C 13/00* (2006.01)
*G06F 13/16* (2006.01)
(Continued)

(52) U.S. Cl.
CPC ...... *G11C 13/0069* (2013.01); *G06F 13/1668* (2013.01); *G11C 13/004* (2013.01); *G11C 13/0011* (2013.01); *G11C 13/0023* (2013.01); *G11C 13/0061* (2013.01); *G11C 7/227* (2013.01); *G11C 16/32* (2013.01);
(Continued)

(58) Field of Classification Search
CPC ............ G11C 13/0069; G11C 13/0011; G11C 13/004; G11C 13/0061; G11C 13/0023; G11C 2216/20
See application file for complete search history.

(56) References Cited

U.S. PATENT DOCUMENTS 5,287,469 A     2/1994  Tsuboi
5,941,990 A  *  8/1999  Hiiragizawa ......... G06F 1/3203
                                                    713/310

(Continued)

OTHER PUBLICATIONS

Spansion, Data Sheet, "CMOS 3.0-Volt Flash Non-Volatile Memory Serial Peripheral Interface (SPI) with Multi-I/O Industrial and Extended Temperature," Apr. 14, 2014.

*Primary Examiner* — Vanthu Nguyen
(74) *Attorney, Agent, or Firm* — Michael C. Stephens, Jr.

(57) ABSTRACT

A method of controlling an NVM device can include: (i) receiving, by an interface, a write command from a host; (ii) beginning execution of a write operation on a first array plane of a memory array in response to the write command, where the memory array includes a plurality of NVM cells arranged in a plurality of array planes; (iii) receiving, by the interface, a read command from the host; (iv) suspending the write operation in response to detection of the read command during execution of the write operation; (v) beginning execution of a read operation on a second array plane in response to the read command; and (vi) resuming the write operation after the read operation has at least partially been executed.

20 Claims, 20 Drawing Sheets

(51) Int. Cl.
*G11C 16/32* (2006.01)
*G11C 29/02* (2006.01)
*G11C 7/22* (2006.01)

(52) U.S. Cl.
CPC .......... *G11C 29/021* (2013.01); *G11C 29/028* (2013.01); *G11C 2213/71* (2013.01); *G11C 2216/20* (2013.01)

(56) References Cited

U.S. PATENT DOCUMENTS

| | | | | |
|---|---|---|---|---|
| 6,182,189 | B1* | 1/2001 | Alexis | G06F 13/4243 365/189.04 |
| 6,337,809 | B1* | 1/2002 | Kim | G11C 7/1006 365/189.011 |
| 6,922,758 | B2 | 7/2005 | Roohparvar | |
| 7,349,245 | B2* | 3/2008 | Kim | G11C 13/0004 365/158 |
| 7,881,145 | B2* | 2/2011 | Lee | G11C 7/22 365/163 |
| 2002/0163848 | A1* | 11/2002 | Grasso | G11C 7/1018 365/230.03 |
| 2007/0239926 | A1 | 10/2007 | Gyl et al. | |
| 2008/0098163 | A1 | 4/2008 | Lin | |
| 2010/0250874 | A1 | 9/2010 | Farrell et al. | |
| 2011/0096611 | A1* | 4/2011 | Lee | G11C 7/22 365/189.07 |
| 2012/0179860 | A1* | 7/2012 | Falanga | G11C 16/102 711/103 |
| 2013/0128675 | A1 | 5/2013 | Kim et al. | |
| 2014/0063922 | A1* | 3/2014 | Kim | G11C 8/08 365/158 |

\* cited by examiner

CONCURRENT READ AND WRITE OPERATIONS IN A SERIAL FLASH DEVICE

RELATED APPLICATIONS

This application claims the benefit of U.S. Provisional Application No. 62/021,840, filed Jul. 8, 2014, and which is incorporated herein by reference in its entirety.

FIELD OF THE INVENTION

The present invention generally relates to the field of semiconductor devices. More specifically, embodiments of the present invention pertain to flash memory devices, sensor hubs, resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

In one embodiment, a non-volatile memory (NVM) device can include: (i) an interface configured to receive write and read commands from a host; (ii) a memory array including a plurality of NVM cells arranged in a plurality of array planes; and (iii) a memory controller configured to execute a write operation on a first array plane in response to the write command, and to execute a read operation on a second array plane in response to the read command, where the memory controller is configured to suspend the write operation in response to detection of the read command during execution of the write operation, and where the memory controller is configured to resume the write operation after the read operation has at least partially been executed.

In one embodiment, a method of controlling an NVM device, can include: (i) receiving, by an interface, a write command from a host; (ii) beginning execution of a write operation on a first array plane of a memory array in response to the write command, where the memory array includes a plurality of NVM cells arranged in a plurality of array planes; (iii) receiving, by the interface, a read command from the host; (iv) suspending the write operation in response to detection of the read command during execution of the write operation; (v) beginning execution of a read operation on a second array plane in response to the read command; and (vi) resuming the write operation after the read operation has at least partially been executed.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Architecture

Particular embodiments may be directed to Flash devices, as well as to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating Flash and/or resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
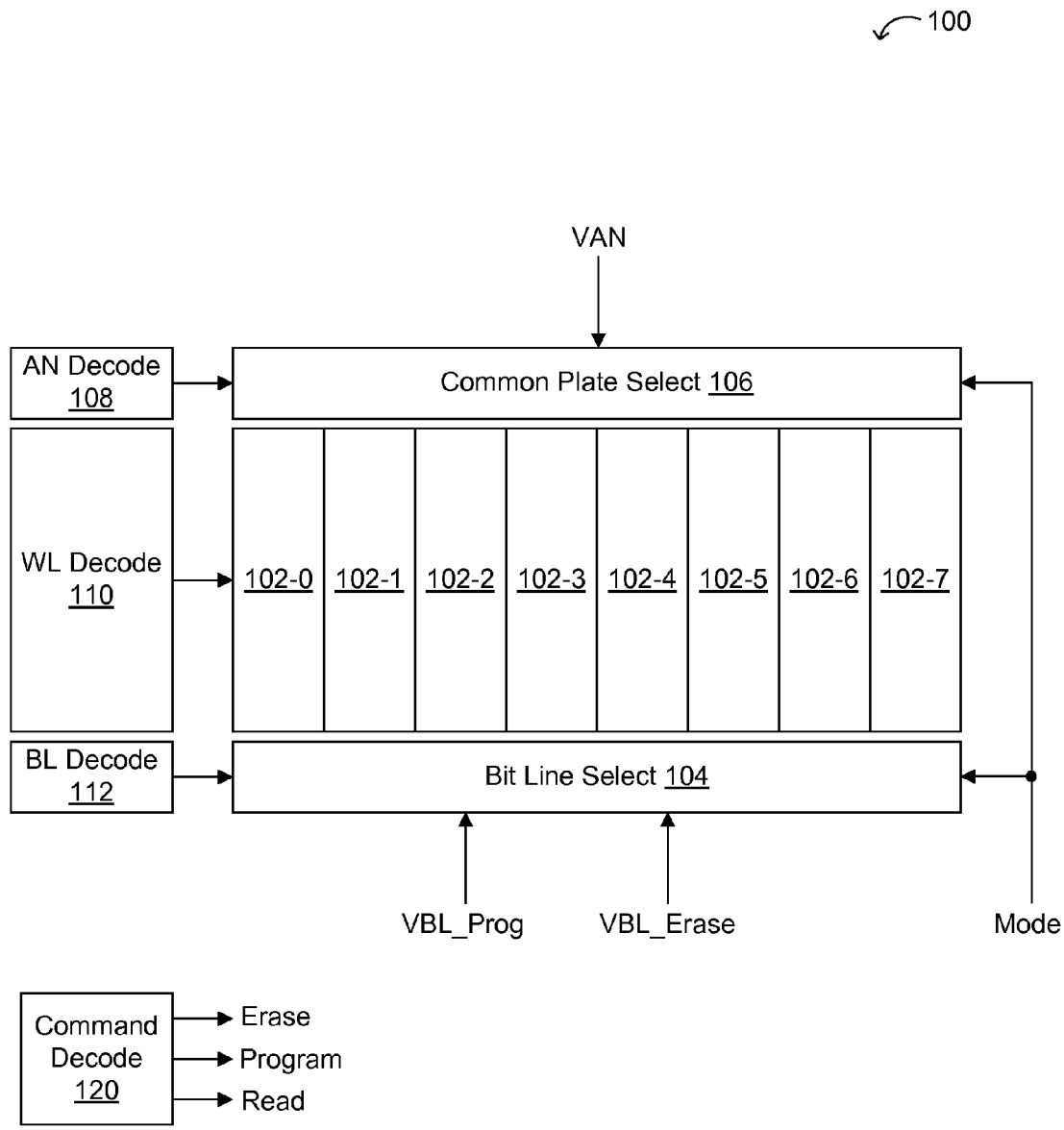
FIG. 1 is an example memory device arrangement.
Figure 2:
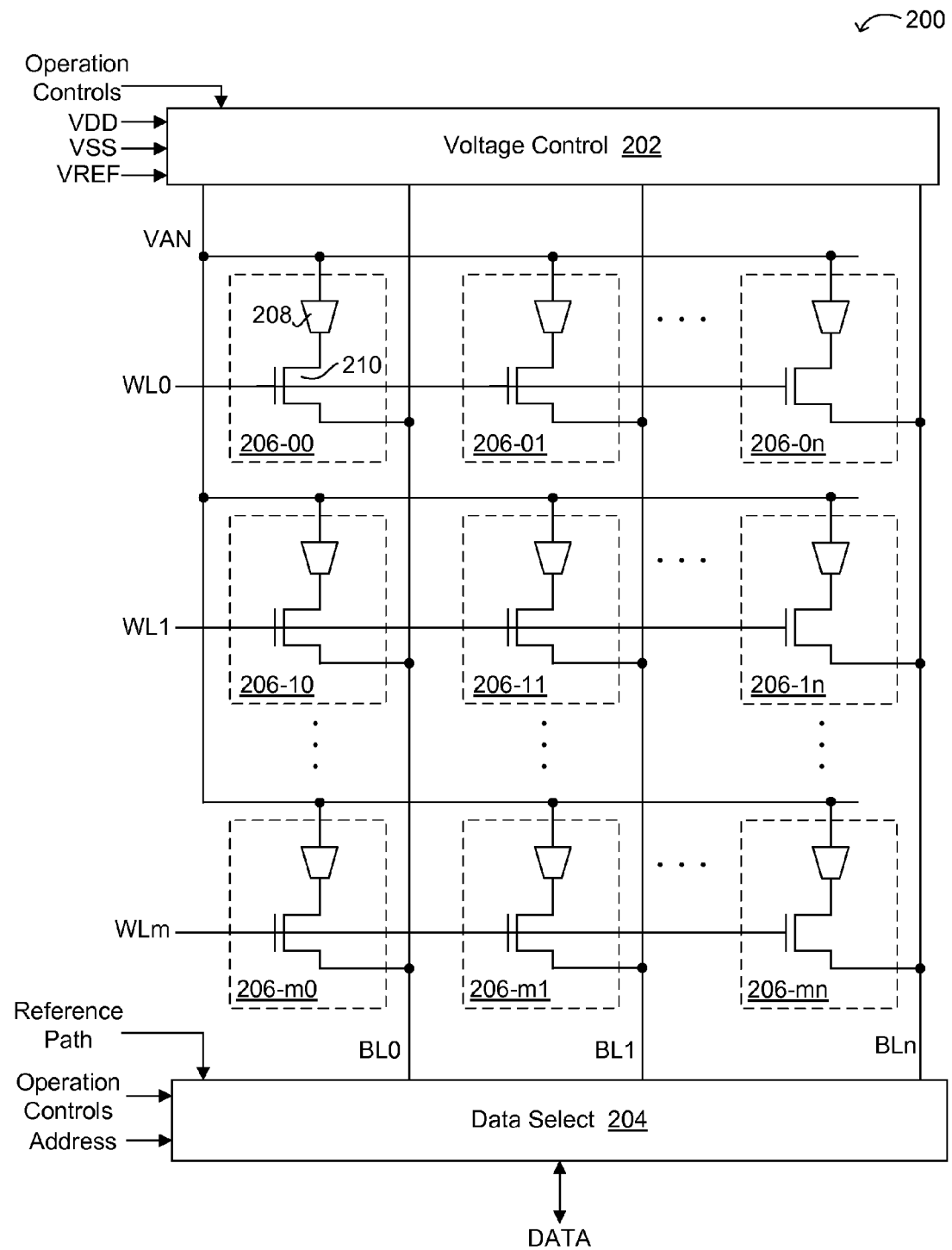
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a de-select voltage (e.g., low) by associated word line drivers. Bit line selection circuitry 104 can place bit lines BL0 and BL1 in the de-selected state. Similarly, common plate selection circuitry 106 can place common anode plates in the de-select state.

In a program operation, in response to address and mode data, bit line selection signals can be used to connect a selected bit line to read/write control circuitry via data select 204. In contrast, other bit lines can be de-selected, and thus placed in the de-selected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
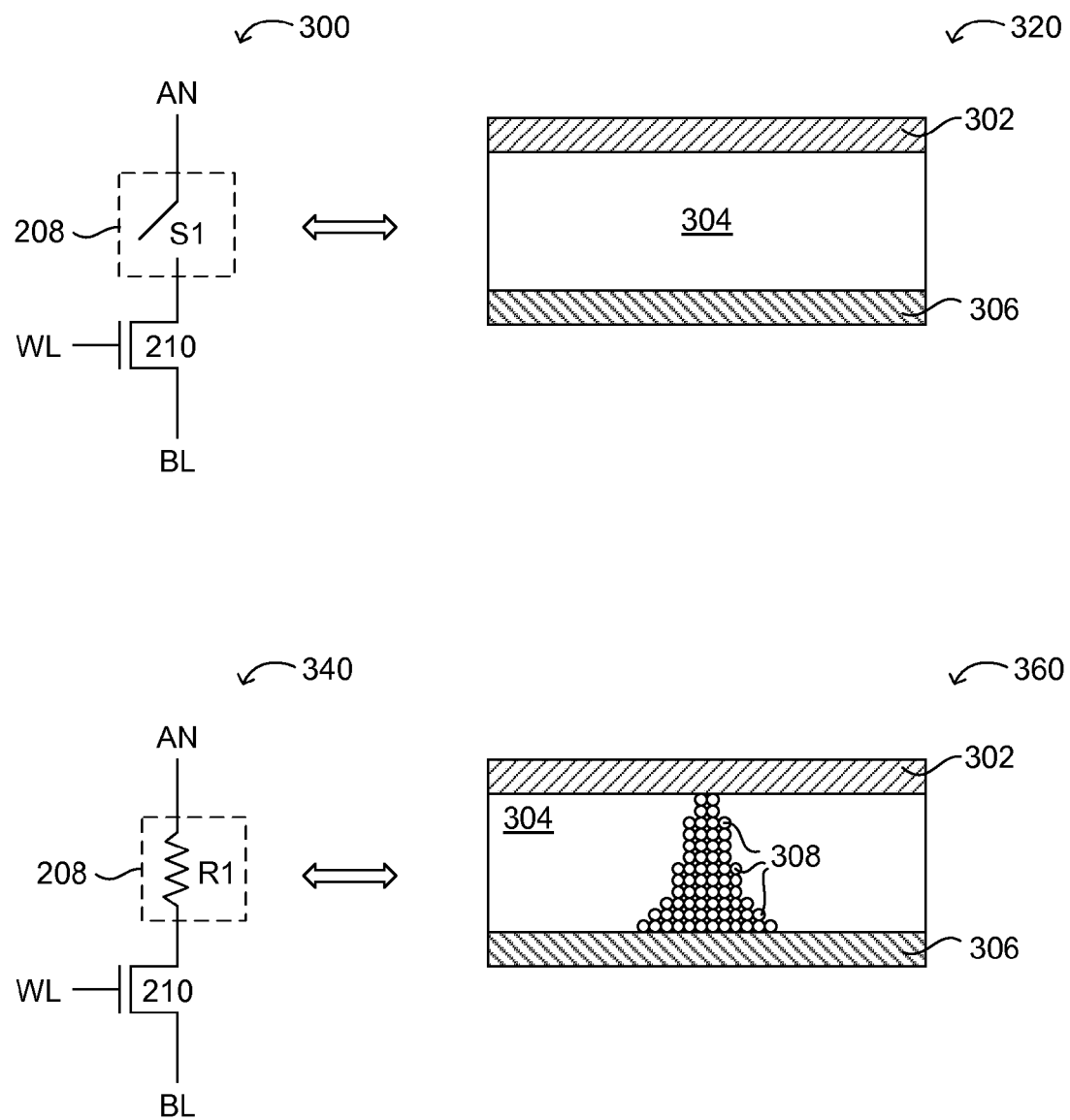
FIG. 3 is a diagram of an example programmable impedance element with schematic modeling.

Referring now to FIG. 3, shown is a diagram of an example programmable impedance element with schematic modeling. For example, example 300 shows a memory cell with an open switch 51 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Concurrent Read and Write Operations in a Memory Device

Particular embodiments are suitable to any form of non-volatile memory (NVM), such as flash memory, R-RAM, M-RAM, E2ROM, and CBRAM, to name a few. As described herein, a write operation may be any operation on a memory (e.g., NVM) device that is intended to change a state of at least one of the memory locations on the device. As discussed above, write operations can include program operations (e.g., to change a data state from 1 to 0) and erase operations (e.g., to change a data state from 0 to 1). Of course, the data states and/or resistance levels of the storage element can be predefined in any suitable way; however, the write operation can generally involve ensuring that a memory cell is put into or remains in the desired state.

As described herein, an in-place execution is a central processing unit (CPU) mode of operation whereby the NVM is part of the program memory hierarchy. In such an arrangement, at least some of the program may be fetched directly out of the NVM and into the CPU and/or an associated cache. However, in systems that do not support in-place execution, the contents of the NVM may first be copied into a memory device in the memory hierarchy, and then the program can be fetched from that memory device by the CPU. Also as described herein, a serial NVM device can be an NVM device with an interface to the host CPU that is serial in nature. For example, such serial types of interfaces can include serial peripheral interface (SPI) and inter-integrated circuit (I2C). Also, many NVM devices have time-wise asymmetrical read and write operations, whereby the write operations (e.g., erase operations) may take a significantly longer time than read operations.

In many applications, the CPU can execute in-place (e.g., perform program fetches/reads) directly out of the NVM, while the CPU may occasionally write into the NVM. However, conventional NVM devices may not allow performing a read operation while a write operation is in progress. As a result, the processor may not be able to fetch instructions for a relatively long period of time, in some cases. Furthermore, since there is no "backpressure" mechanism in most serial interfaces, the memory may not be able to extend a CPU fetch by adding wait-states. Thus, if the processor issues a fetch request while the memory is performing a write operation, the fetched data may be corrupted, or may otherwise not be usable.

To avoid crashing the system, such as due to retrieving corrupted data, the processor may need to have an alternative program memory (e.g., an on-chip ROM or RAM) from which a program can be executed (e.g., including program fetches/reads) during such write operations to the NVM. However, this approach can be cumbersome, less flexible than having the program code in a modifiable NVM, and may be more difficult to maintain. To ensure correct operation, the system may be designed such that the CPU may not attempt to fetch its program from the NVM while a write operation is in progress. As some events, such as interrupts, are asynchronous to the control flow of the CPU, these can be disabled or their service code can be placed in an alternative memory array. Further, in some cases, this approach may have lower performance than having program code residing in an NVM, whereby the processor could continue executing a program while the NVM is being written.

In another approach, the CPU can send an explicit request to the NVM to "pause" the write operation that is in progress. Doing this may require dedicated hardware in the host interface (e.g., a block that translates CPU requests into NVM commands) that can be aware of the NVM performing a write operation while the CPU is attempting to perform a program fetch from the NVM. However, this approach may reduce the system performance due to, among other things, the extra latency that may be added by sending the "pause" request, as well as the time it takes for the NVM to accommodate the pause request. Many serial NVM devices have a specific command that pauses the write operation when given. In such a case, when the write operation is paused, the NVM can be read. Also, another command can be used to resume the paused write operation.

Such a pause command could be used each time that the processor needs to perform a fetch from the NVM. To accomplish this, a smart NVM interface on the CPU chip may be informed that a write operation on the NVM is in progress. Each time the host interface detects a CPU fetch/read request, the NVM read command can be preceded by a pause request to pause the write operation on the NVM, and then the host interface may follow by a resume request to resume that write operation. However, many serial NVM devices require 100 s of uSec in order to implement the pause operation, thus making this approach relatively slow for relatively fast CPUs.

Some NVM devices with a parallel interface can support true concurrent read and write operations. Such devices may fully duplicate circuitry in order to allow for this concurrency in operations. In addition to the extra silicon required for this circuitry duplication, there can be a design challenge of ensuring that noise created by one operation does not impact the other operation. One example of such a noise issue involves a write operation that generally requires the generation of a high-voltage with an on-chip switching power source/supply, as well as charge pump circuitry. The switching and/or pumping can be very noisy, and may impact operation of the relatively sensitive sense amplifiers that are used for the read operation. Thus, noise from a write operation can cause circuit operation problems for a read operation when performed concurrently.

In particular embodiments, an NVM can automatically detect one or more read operations while the NVM is performing a write operation, may relatively quickly pause/suspend the write operation in response thereto, and then may resume the write operation when it is safe to do so relative to execution of the read operation. For example, it may be considered safe to resume the write operation once the read operation is far enough along so as to not be affected by any potential noise (e.g., due to supply pumps) from the write operation. Also, the pausing of the write operation may be with either no change or a minimal change in the timing of the read operation. Further, the pause of such a write operation may not need to be absolute. Rather, enough write-related circuitry may be stopped or disabled such that the read operation can be executed correctly.

As described herein, such a pause of the write operation may interchangeably be referred to as a "partial pause," a "pause," an "auto-suspend," a "stall," or a "suspension" of the write operation, and/or the execution thereof, due to an "interruption" by a read operation. In addition, the memory array can be arranged in different portions, whereby a write operation to one such portion can be interrupted by a read to another such portion. As described herein, such a memory array "portion" of sub-array may interchangeably be referred to as a "plane," a "block," a "zone," or a "region." Thus for example, the NVM memory cells may reside in one plane or another plane on an NVM device. Also in particular embodiments, more than two planes (e.g., N planes) of NVM memory cells can be accommodated.

Figure 4:
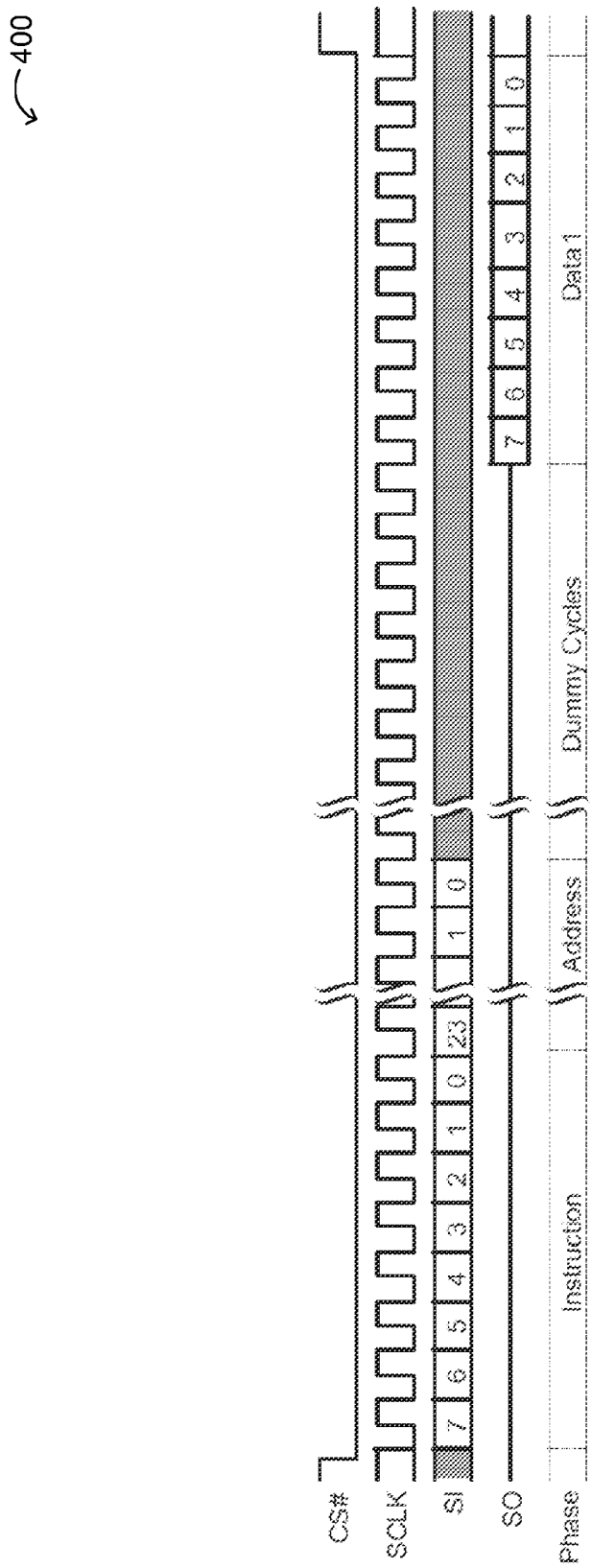
FIG. 4 is a waveform diagram of an example fast read command sequence.
Figure 5:
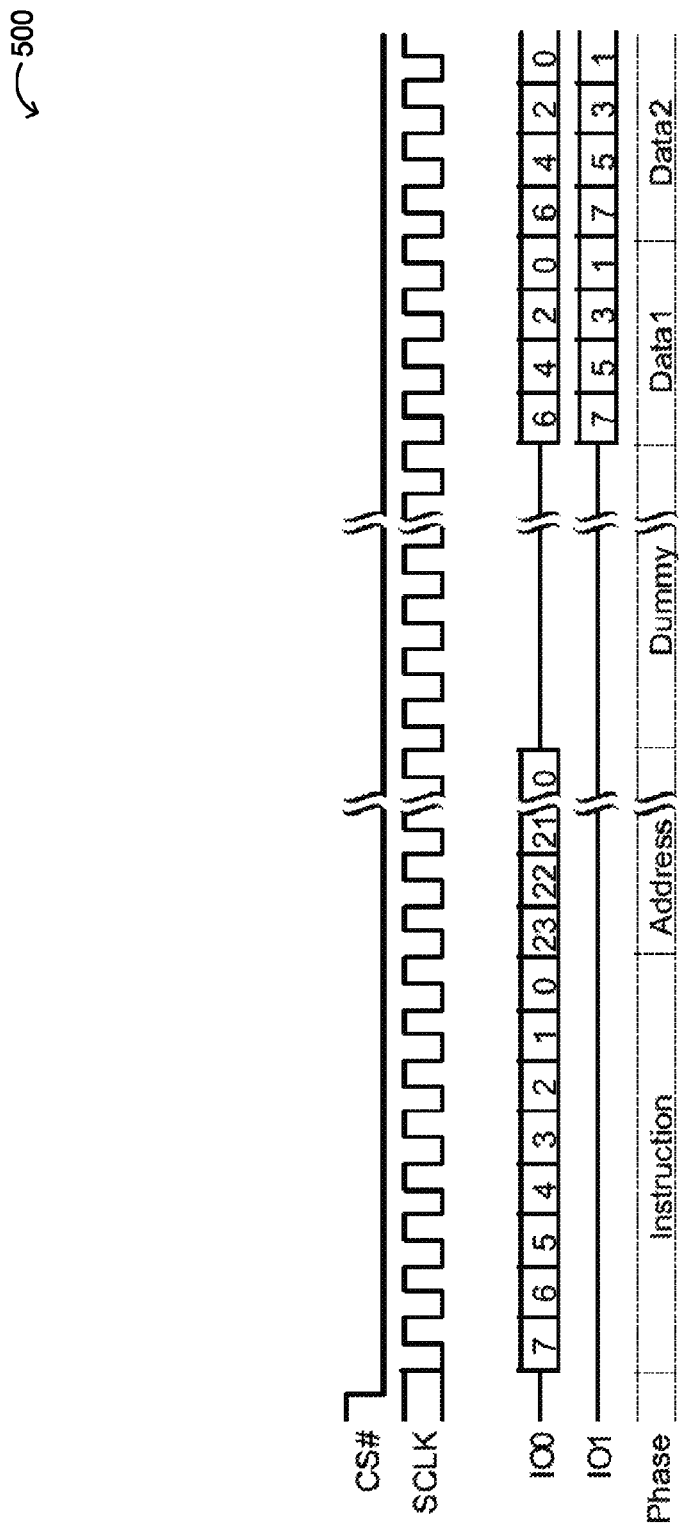
FIG. 5 is a waveform diagram of an example fast read dual output command sequence.
Figure 6:
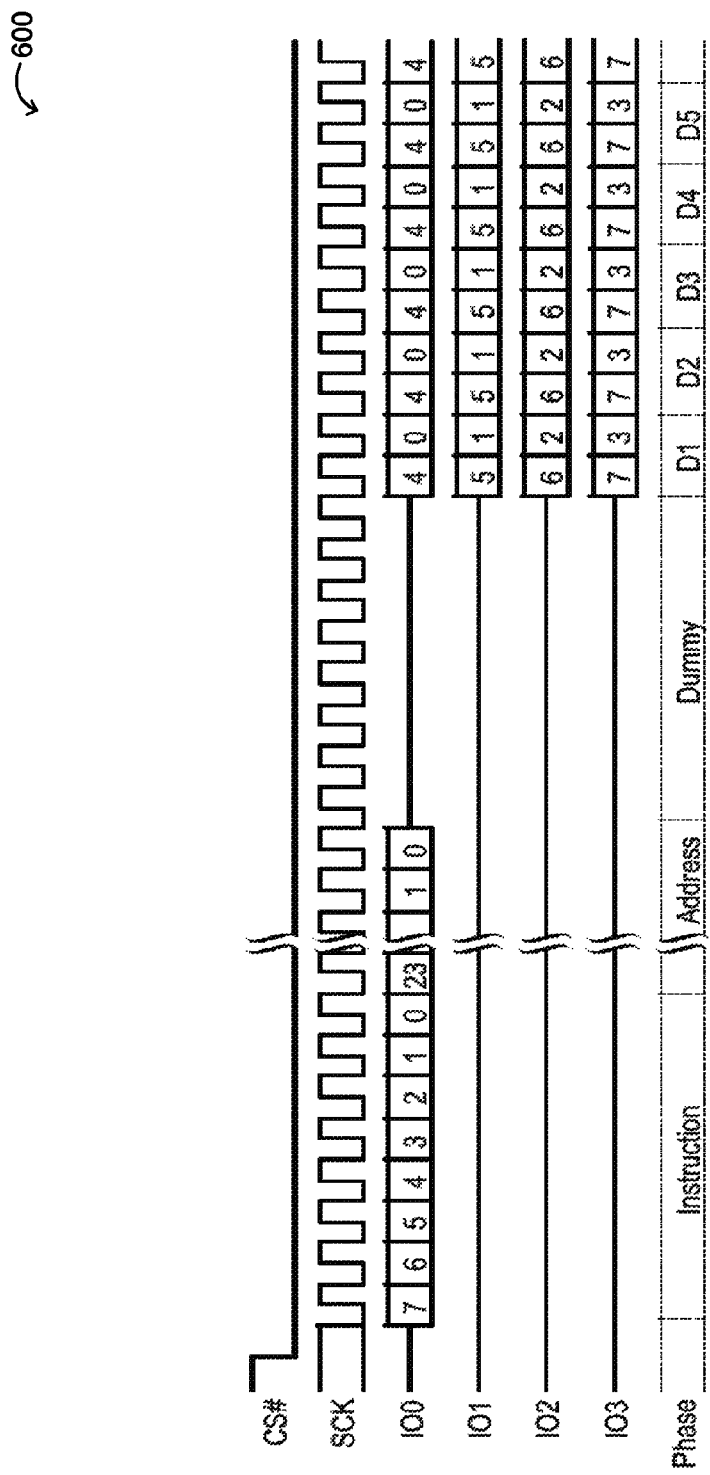
FIG. 6 is a waveform diagram of an example fast read quad output command sequence.
Figure 7:
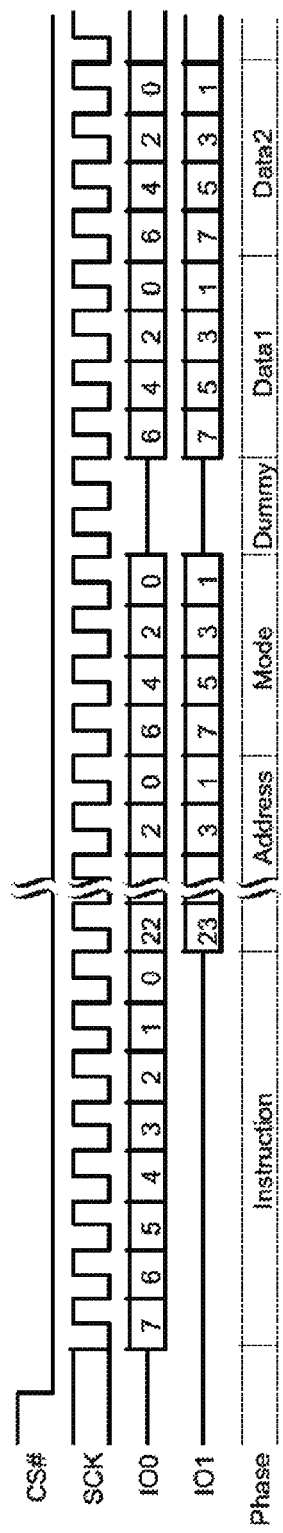
FIG. 7 is a waveform diagram of an example fast read dual I/O command sequence.
Figure 8:
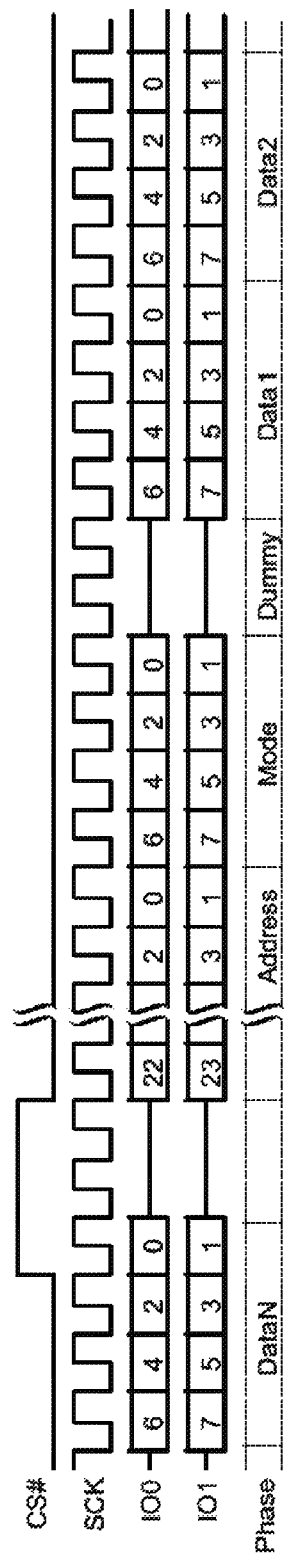
FIG. 8 is a waveform diagram of an example fast read dual I/O command sequence.
Figure 9:
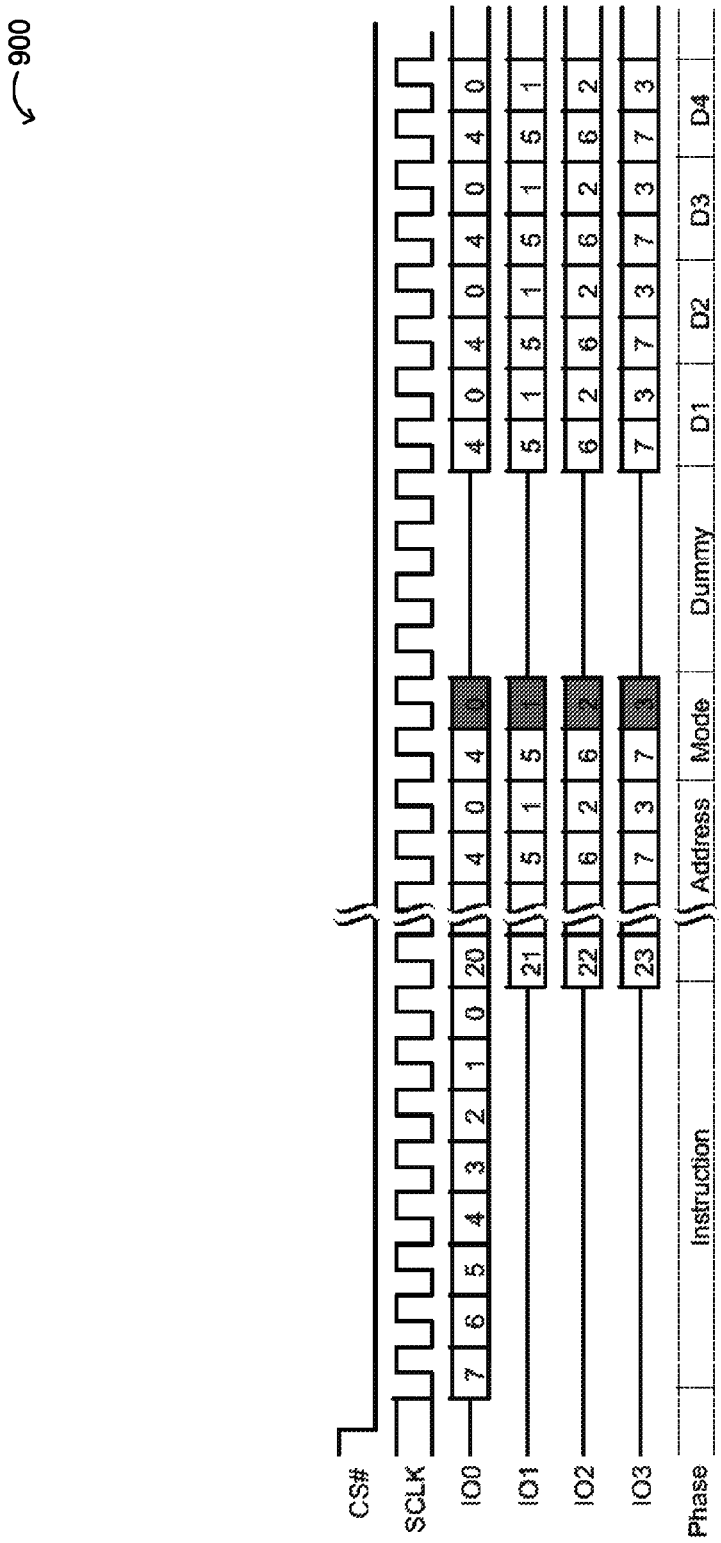
FIG. 9 is a waveform diagram of an example fast read quad I/O command sequence.
Figure 10:
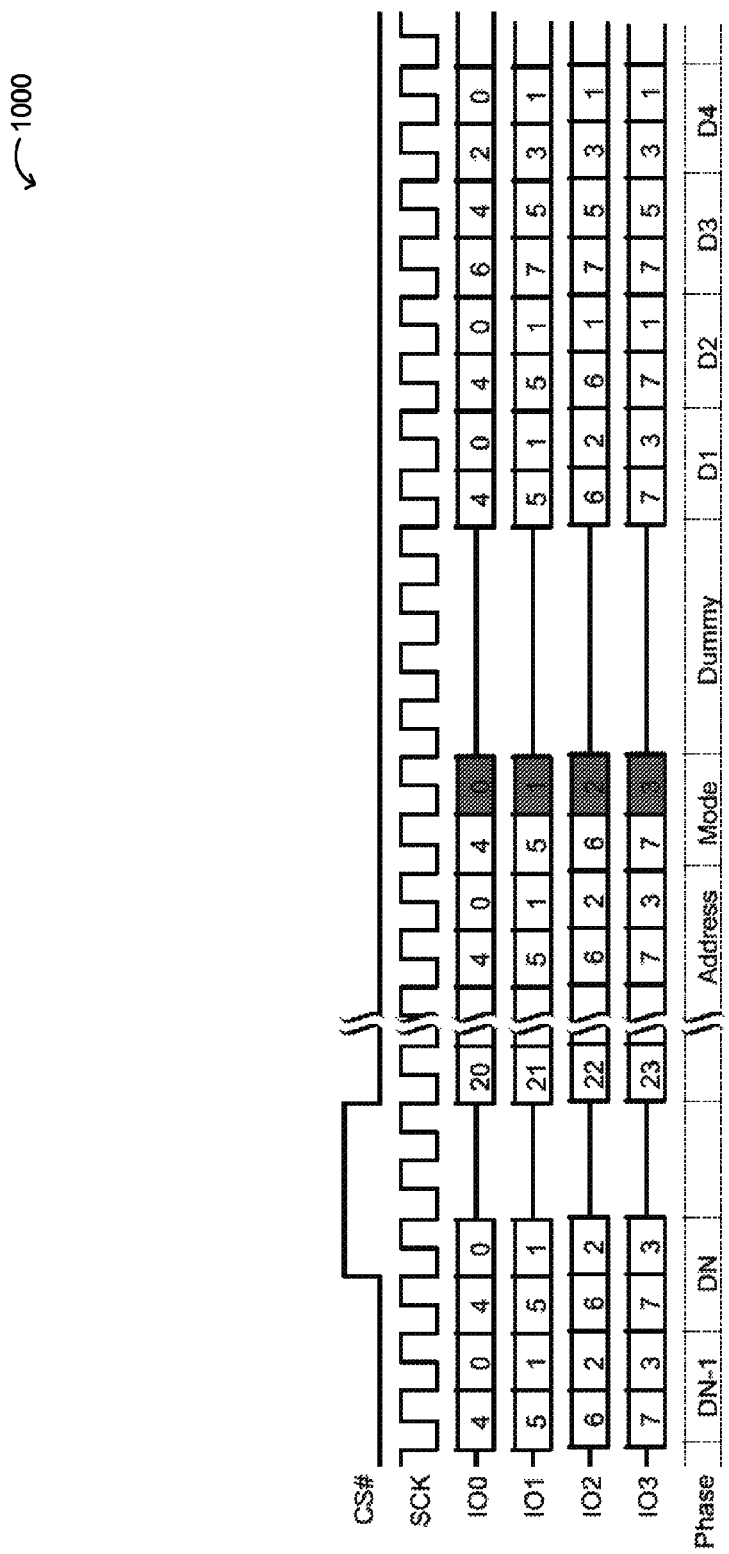
FIG. 10 is a waveform diagram of an example fast read quad I/O command sequence.

Referring now to FIGS. 4-10, shown are waveform diagrams of various standard SPI command sequences. While the examples are described with respect to an SPI type of interface, particular embodiments are suitable to other serial and/or parallel interfaces. Standard SPI read commands may start with chip select (CS) going low, followed by instruction (e.g., 8-bits), address (e.g., 24-bits, or less), mode (e.g., 8-bits), N dummy bytes (e.g., each byte is 8-bits, and N may be configurable), and data (e.g., multiple 8-bit bytes). FIG. 4 shows a waveform diagram 400 of an example fast read command sequence, FIG. 5 shows a waveform diagram 500 of an example fast read dual output command sequence, and FIG. 6 shows a waveform diagram 600 of an example fast read quad output command sequence. The mode bits may specify a continuous read mode, and in that case, the next command may be implied to also be a read, thus potentially saving 8-bits of overhead by not having to send the instruction bits. FIGS. 7-10 show waveform diagrams (700, 800, 900, and 1000) of example fast read dual I/O command sequences.

Figure 11:
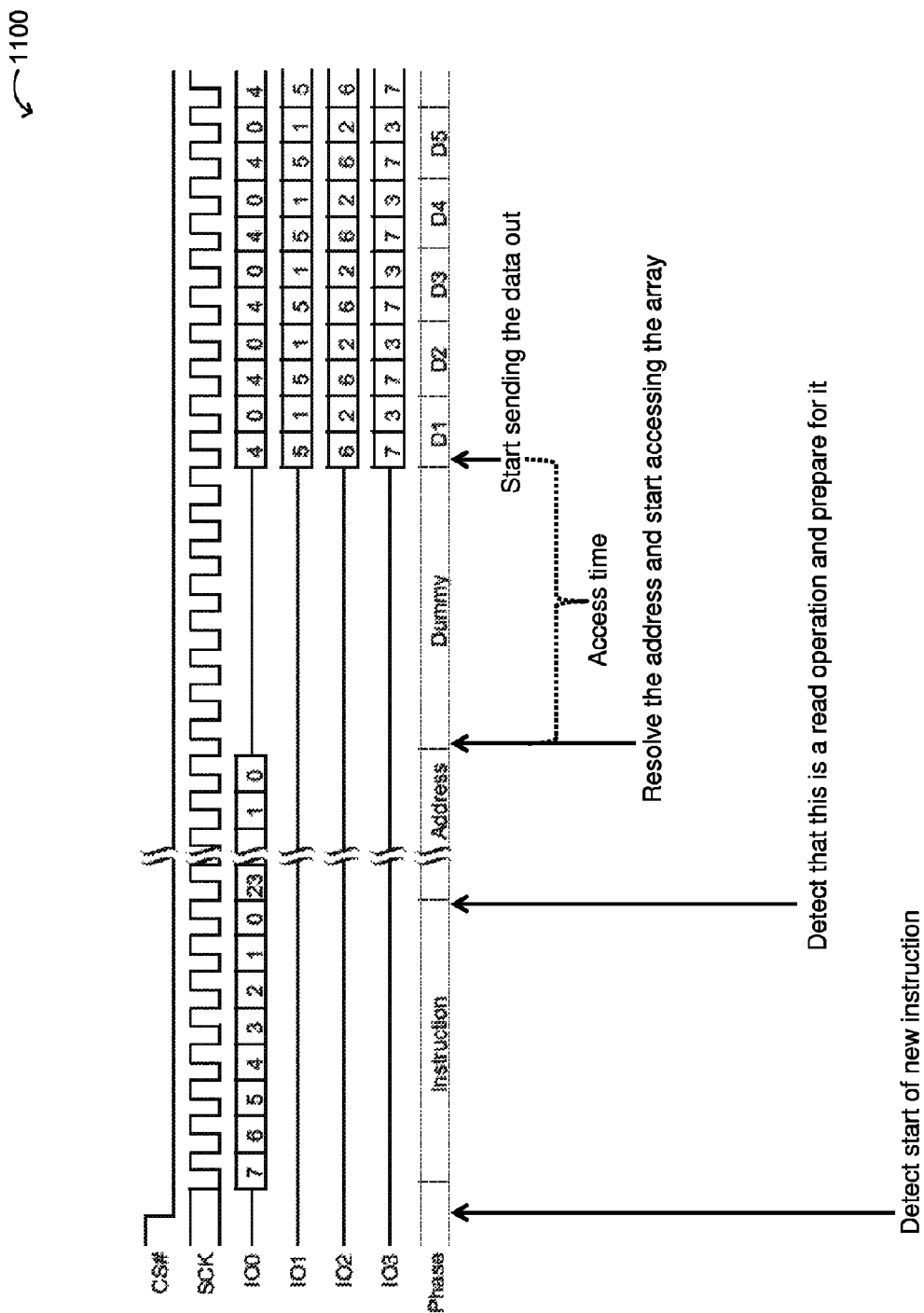
FIG. 11 is a waveform diagram of an example flash internal operation.

Referring now to FIG. 11, shown is a waveform diagram 1100 of an example flash internal operation. In this example, SPI commands and data are provided serially on one, two, or four lines (Quad SPI). In full Quad SPI mode, 4 bits may be sent (e.g., to/from an NVM) each clock cycle, and different clock frequencies may be supported. For example, the clock (SCK) may go up to about 100 MHz, up to about 120 MHz, or up to a higher frequency. The timing of an SPI read command in full Quad SPI mode can include instruction (e.g., 8-bits—2 clock cycles—about 20 ns), address (e.g., 24-bits or and less—6 clock cycles—about 60 ns), mode (e.g., 8-bits—1 clock cycle—about 10 ns), N dummy bytes (e.g., each byte is 8-bits, N may be configurable—N clock cycles—about N×10 ns), and data (e.g., multiple 8-bit bytes). The NVM can start preparing for a read operation after decoding the instruction, and actual data access can start after the address has been received. Also, the access time can be 1+N cycles (e.g., one for the mode byte, and N for the dummy bytes).

In particular embodiments, while the NVM device is performing/executing a write operation, the NVM device can detect incoming read operations, and may perform at least a partial pause of the write operation in order to ensure that the read operation can be processed. The write operation can resume when the read operation is over, or is at least partially executed and far enough along so as to not be disturbed by noise related to the write operation. Available timing for performing a partial pause can be limited in full Quad SPI mode. Thus, transitioning into a partial pause can start immediately after a read command is detected, and the NVM may be in partial pause before the read access starts. In this case, only 6 clock cycles may remain to perform the partial pause. In some cases, the NVM device can start the transition 2 cycles earlier (e.g., immediately after detecting CS going low), but this can cause write pauses even if the detected command was not a read command (e.g., a command that polls the NVM status).

Figure 12:
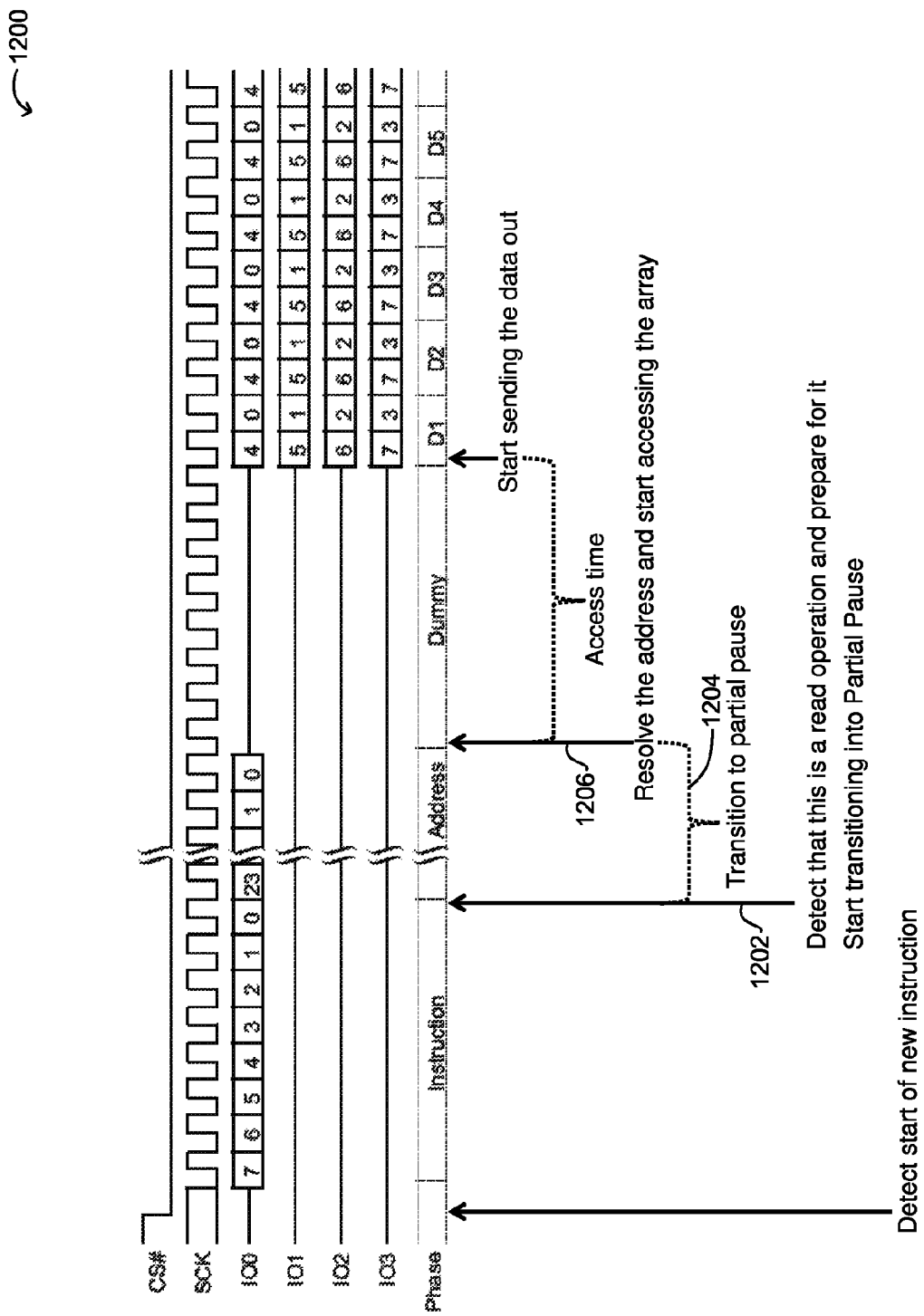
FIG. 12 is a waveform diagram of an example transition to partial pause, in accordance with embodiments of the present invention.

Referring now to FIG. 12, shown is a waveform diagram 1200 of an example transition to partial pause, in accordance with embodiments of the present invention. If a write operation is ongoing, the new command can be detected at 1202 as a read command. In response to detection of the read operation, a transition to a partial pause can occur over a time portion as shown at 1204. Thus, at 1206 at the end of transition time portion 1204, the write operation can effectively be paused, and the read access can occur as part of execution of the read command. After the access time has elapsed, data can begin to be output from the NVM in a serial fashion, as shown. As will be discussed in more detail below, pausing of the write operation can include such adjustments so as to minimize noise or other possible interferences with proper execution of the read operation.

Figure 13:
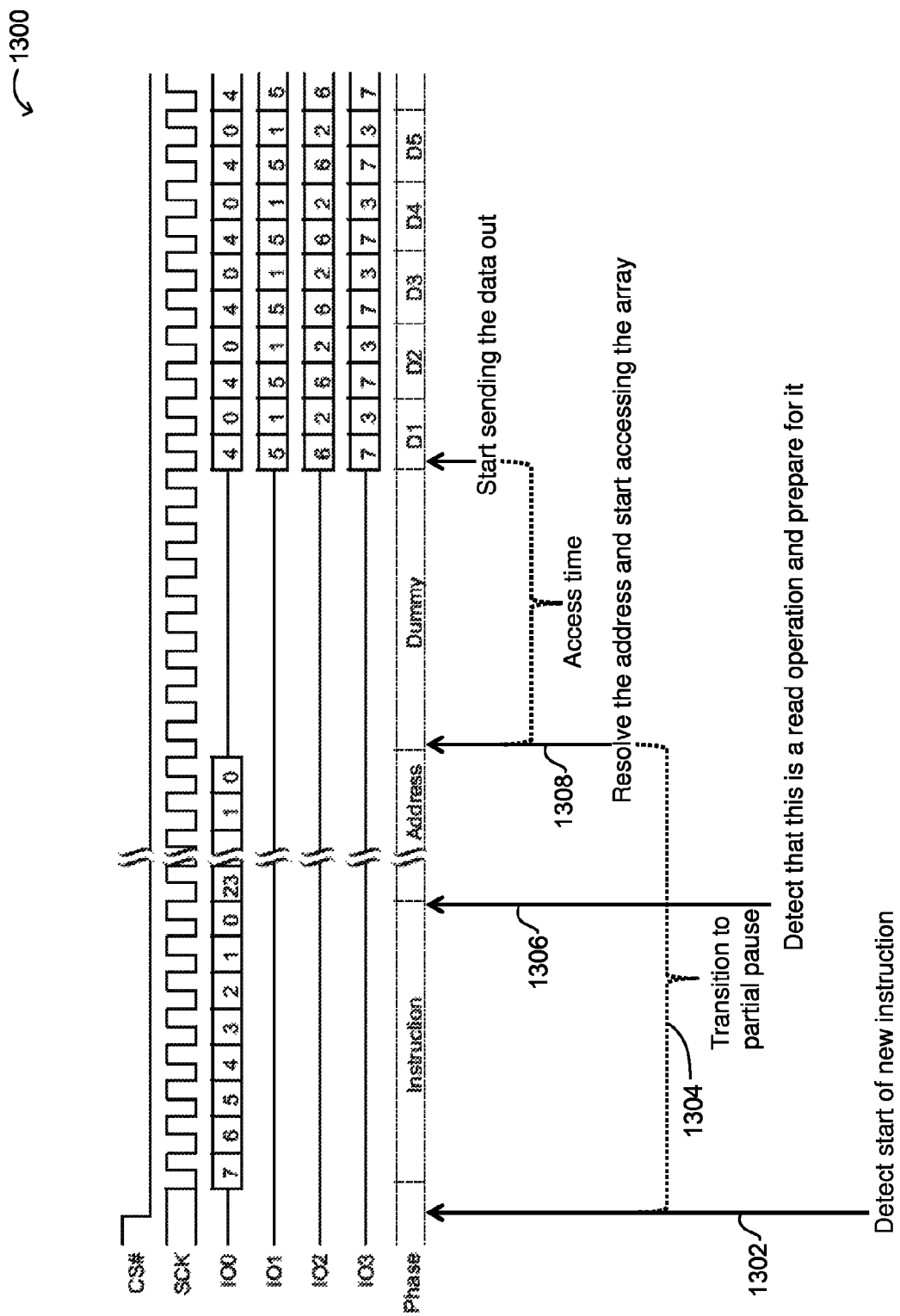
FIG. 13 is a waveform diagram of an example alternative transition to partial pause, in accordance with embodiments of the present invention.

Referring now to FIG. 13, shown is a waveform diagram 1300 of an example alternative transition to partial pause, in accordance with embodiments of the present invention. In this particular example, a start of a new instruction can be detected at 1302. At this point, the device does not know whether this new instruction is a read operation, or some other type of operation. However, the new operation can be taken as a read operation for purposes of transitioning to a partial pause of an ongoing write operation, as shown by time portion 1304. Thus, new commands can be speculatively taken as read command in order to start the transition into a partial pause sooner. For example, more time can be allowed for a smoother transition to a standby state on regulators and/or pump circuitry that is related to the write operation. If at 1306, the new instruction is detected as a read command, the partial pause can be farther along, and the access of the memory array can begin at 1308. If however, the new instruction is some other type of command, then execution of the write operation can resume.

Figure 14:
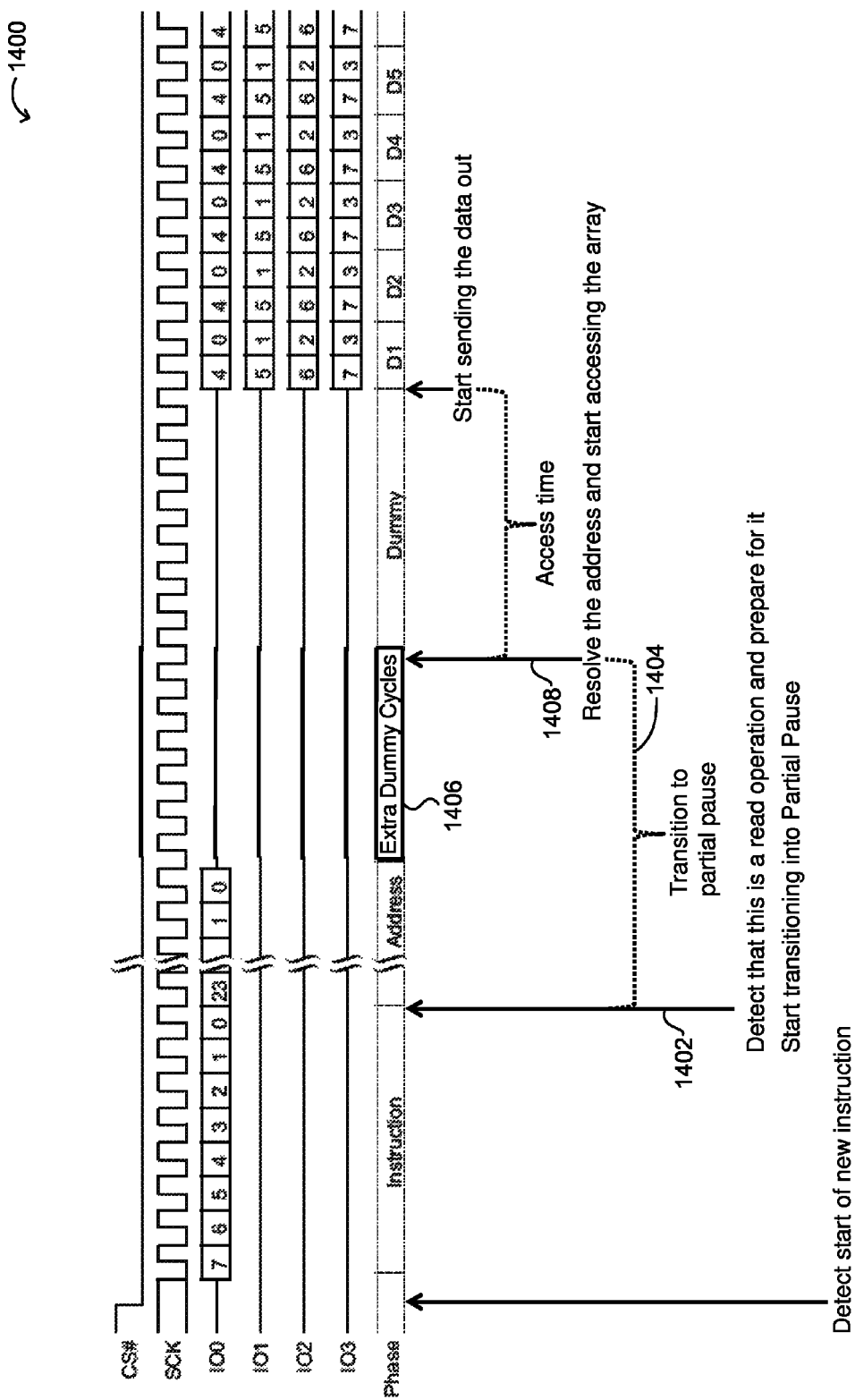
FIG. 14 is a waveform diagram of an example alternative transition to partial pause with additional dummy cycles, in accordance with embodiments of the present invention.

Referring now to FIG. 14, shown is a waveform diagram 1400 of an example alternative transition to partial pause with additional dummy cycles, in accordance with embodiments of the present invention. In this case, the time allowed for transitioning into a partial pause may be increased by adding extra dummy cycles. Here, once the instruction has been provided while the write operation is ongoing, the new instruction can be detected as a read command at 1402. In response, a transition to partial pause can occur during time portion 1404. As part of this transition, extra dummy cycles 1406 can be added in order to allow more time to accommodate the partial pause transition. For example, this extra time may be utilized for capturing the state of the write operation and/or transitioning pump/regulators into standby or quiescent states. At 1408, the read cycle can begin, with data beginning to come out after the access time has elapsed.

In addition, continuous read mode read operations may have even tighter timing constraints because these operations may each be at least 2 cycles shorter, as compared to a standalone read operation. Thus, in some cases, the write operation may remain paused/suspended for as long as the NVM is in the continuous read mode. The write operation can then resume once the continuous read mode has ended. Also, the status register can include a progress counter to measure progress in completing the write operation, such as by counting how many bytes have been written, by counting a number of write pulses, and/or by counting a number of write sub-operations. For example, the host processor can reduce the frequency of read accesses to the NVM device, or take other appropriate action, if the progress counter indicates relatively slow progress in completing the write operation (e.g., due to repeated suspensions as a result of interrupting read operations). In other cases, the NVM can immediately start the transition to a partial pause in a continuous read mode when active low signal CS transitioning low is detected, such as shown in the example of FIG. 13 for a single read operation.

In certain embodiments, additional time can be provided for a partial pause transition by adding dummy cycles and/or by stopping the clock for a predetermined number of cycles as part of, or associated with, the read commands. However, adding such cycles to every read operation may reduce the read throughput of the NVM device. Alternatively, a new read command, a "slow read" command, can be added and may include such extra dummy cycles as part of the associated command sequence. For example, such a slow read command may only be used when the NVM is in a write operation mode, while standard read commands can otherwise be issued when appropriate. In this way, the performance impact of the additional dummy cycles can be reduced. For implementation, the SPI controller on the host device can be changed such that before the CPU/host initiates a write command, the state can be changed to use slow read commands instead of the standard read commands. When the CPU detects that the write operation is completed (e.g., by checking the NVM status), the CPU can then place the SPI controller in a normal mode in which the host again uses standard read commands instead of slow read commands.

Figure 15:
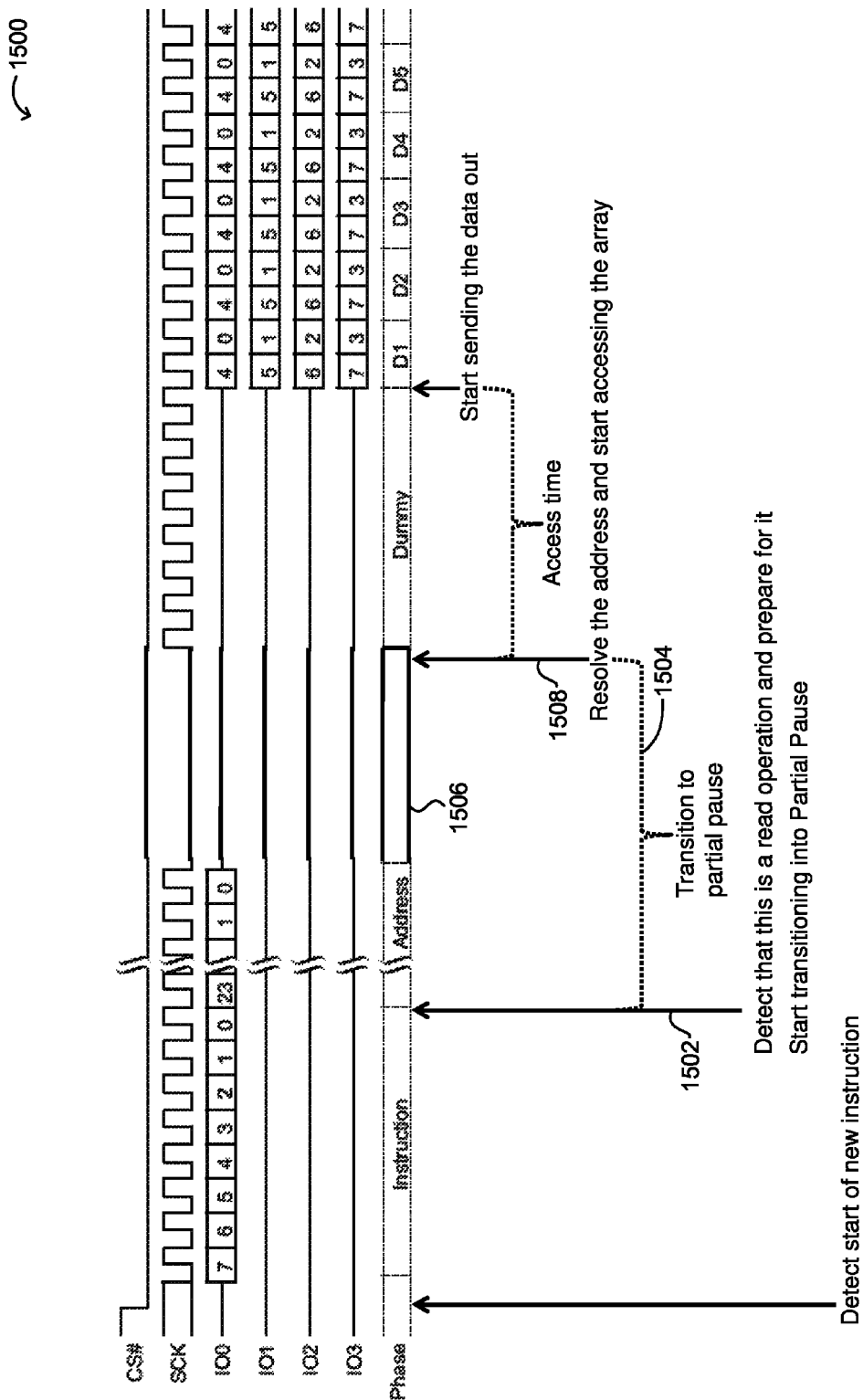
FIG. 15 is a waveform diagram of an example alternative transition to partial pause with clock stoppage, in accordance with embodiments of the present invention.

Referring now to FIG. 15, shown is a waveform diagram 1500 of an example alternative transition to partial pause with clock stoppage, in accordance with embodiments of the present invention. In this case, the time for transitioning into a partial pause may be increased by stopping or suspending the clock for a number of cycles. Here, once an instruction has been provided while the write operation is ongoing, the new operation can be detected as a read operation at 1502. In response to detection of a read command, a transition to partial pause can occur during time portion 1504. As part of this transition, the clock on the interface can be suspended during time portion 1506 in order to allow for more time to accommodate the partial pause transition. At 1508, the read cycle can begin, with data beginning to come out after the access time has elapsed.

In another case, the falling edge of the CS signal can be detected, and may be used to trigger the memory controller state machine, such as in the example of FIG. 13. However, only using a 1-to-0 transition of CS (active low) to trigger the pause action may cause SPI commands that are not read commands to also cause the memory controller state machine to pause. This can result in a larger latency for the write operation when the state machine pauses and restarts on non-read commands. In another implementation, the memory controller state machine can be triggered after waiting until the read command is actually decoded (e.g., at 1502 of FIG. 15). In this way, unnecessary pauses can be substantially eliminated by using the SPI command decoder in the NVM to determine when to request a pause of the memory controller state machine.

The following sections describe various implementation examples for NVM devices, including CBRAM-based devices and/or Flash-based devices. For example, the CBRAM-based architecture and cell functionality discussed above with reference to FIGS. 1-3 can be utilized with a memory controller state machine implementation or other NVM-based controller in order to implement write operation pauses/suspensions, as described herein. Further, any other NVM devices, such as Flash-based devices, including those with serial interfaces, and in some cases parallel interfaces, can also be employed in particular embodiments.

Figure 16:
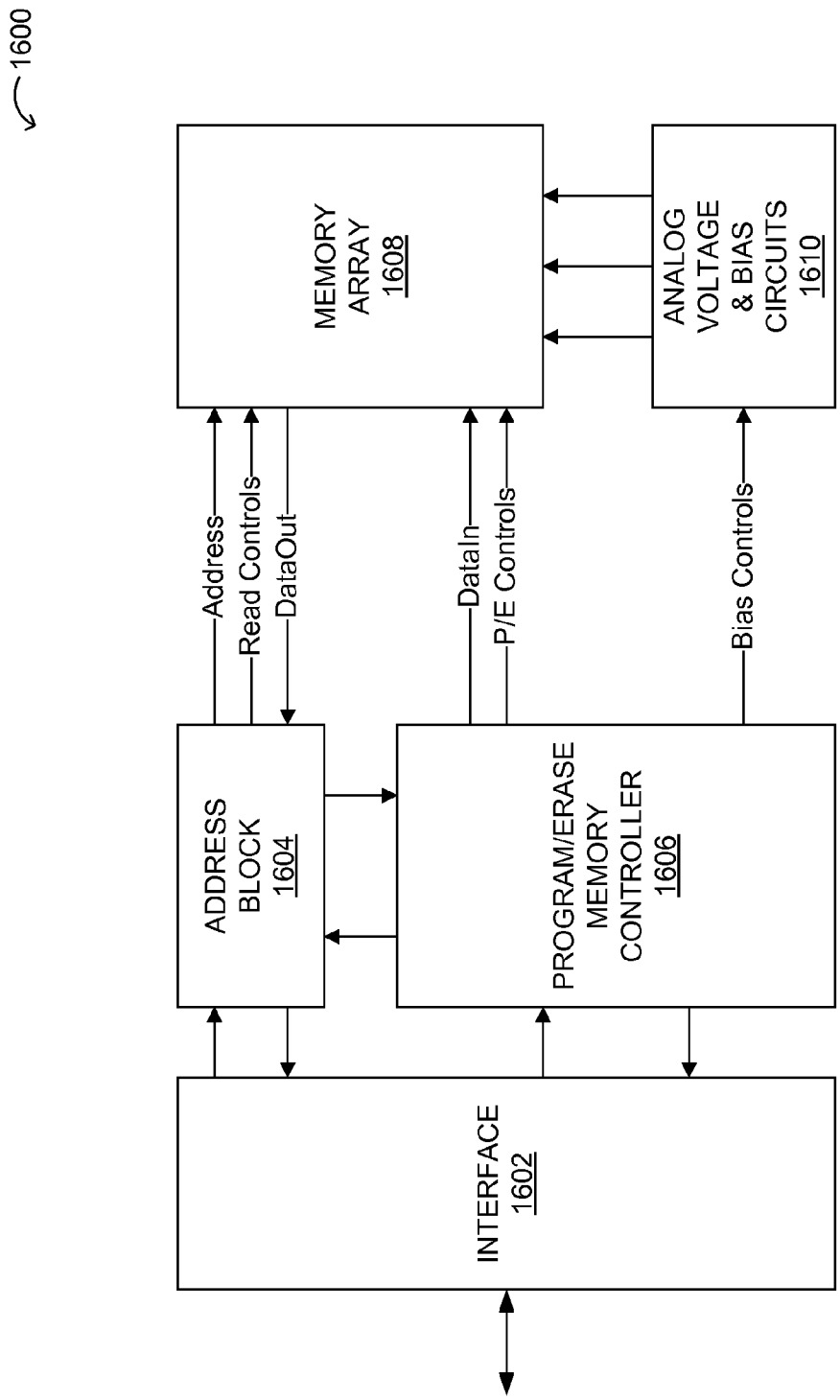
FIG. 16 is a schematic block diagram of an example architecture without support for concurrent read and write operations.

Referring now to FIG. 16, shown is a schematic block diagram of an example architecture 1600 without support for concurrent read and write operations. Architecture 1600 can include interface 1602, such as an SPI interface. Interface 1602 (e.g., a bus interface) can pass address information to address block 1604, and program/erase operation control information to memory controller 1606. Address block 1604 can perform address decoding for accessing memory array 1608. Here, address block 1604 may be shared between read and program/erase operations and controls. Also, memory array 1608 may have a single address bus that is shared between read and program/erase operations. Program/erase controller 1606 can also send bias controls to voltage and bias circuitry 1610, such as for generating the appropriate bias levels for program and erase operations on memory array 1608.

In one embodiment, an NVM device can include: (i) an interface configured to receive write and read commands from a host; (ii) a memory array including a plurality of NVM cells arranged in a plurality of array planes; and (iii) a memory controller configured to execute a write operation on a first array plane in response to the write command, and to execute a read operation on a second array plane in response to the read command, where the memory controller is configured to suspend the write operation in response to detection of the read command during execution of the write operation, and where the memory controller is configured to resume the write operation after the read operation has at least partially been executed.

Figure 17:
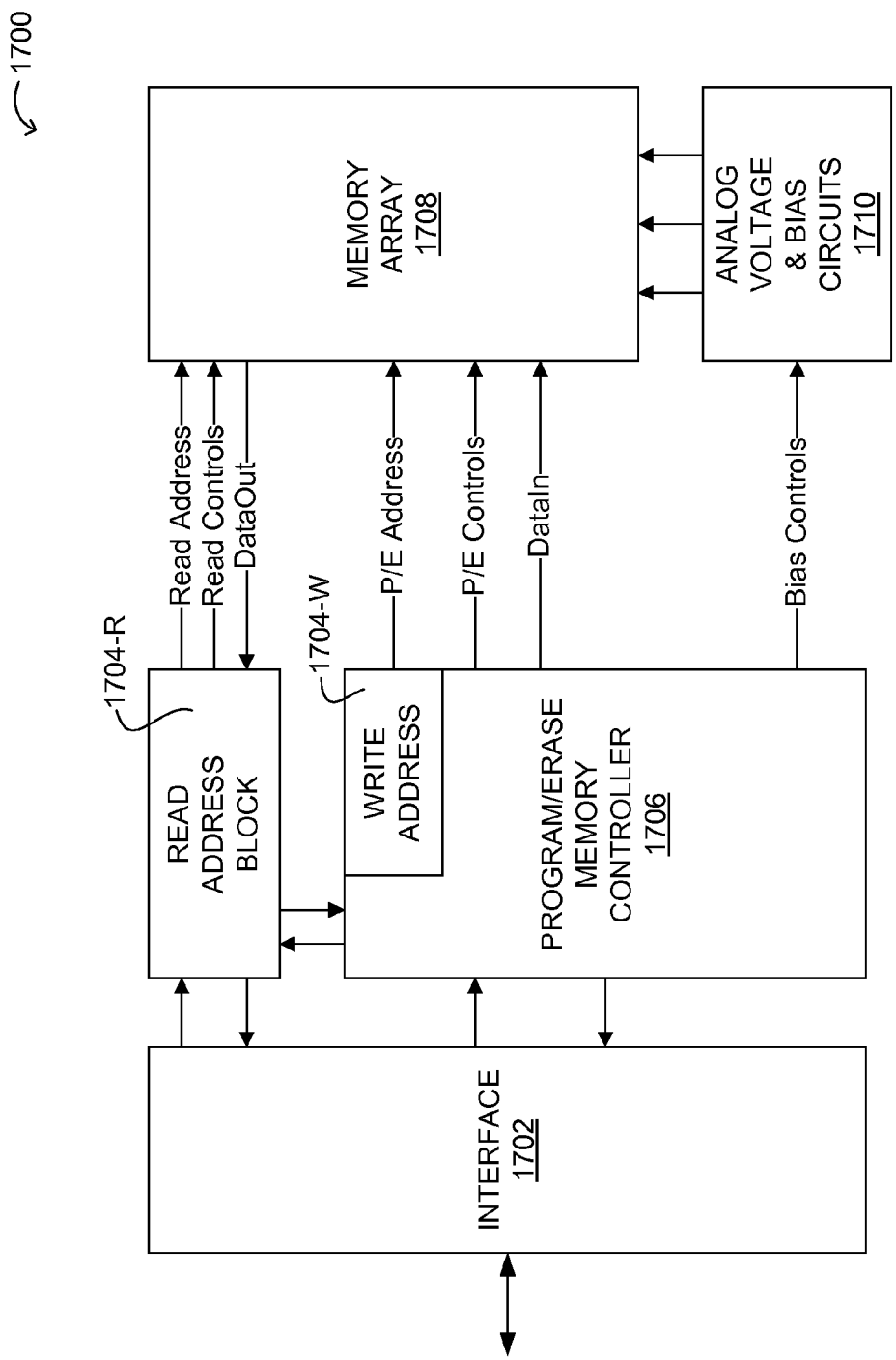
FIG. 17 is a schematic block diagram of an example architecture with concurrent read, in accordance with embodiments of the present invention.

Referring now to FIG. 17, shown is a schematic block diagram of an example architecture 1700 with support for concurrent read and write operations, in accordance with embodiments of the present invention. NVM device architecture 1700 can include interface 1702 (e.g., an SPI interface). Interface 1702 can pass address information to read address block 1704-R, and program/erase operation control information to memory controller 1706. In this case, the read and program/erase address buses may be separated in going to memory array 1708. For example, memory array 1708 may have dedicated address buses for read operations (e.g., from read address block 1704-R) and write operations (e.g., from write address block 1704-W). This can allow program/erase memory controller 1706 to stall the write (program/erase) operation on a first array block (e.g., freezing the program/erase address buses) in memory array 1708, while using the read address bus to read data from a second array block in memory array 1708. The program/erase operation can then be resumed on the first array block after the read operation from the second array block in memory array 1708 is completed, or far enough along and at least partially completed.

Program/erase controller 1706 can also send bias controls to voltage and bias circuitry 1710, such as for generating the appropriate bias levels for program, erase, and read operations on memory array 1708. In this way, the biases (e.g., voltage and/or current biases) on the program/erase selected block can be substantially maintained (e.g., the program/erase control signals may put the program/erase operation in standby) during the partial pause, while the read operation is being executed. For example, the charge pumps used to generate high-voltage biases can be pumped at a lower frequency or standby rate in order to maintain the levels during the partial pause time period because there may be no substantial current draw on these voltage supplies due to the write operation being suspended. Once the read operation has completed and the write operation is to be resumed, the program/erase controls can be activated to resume the write operation, including active pumping of high-voltage charge pumps, or other forms of active voltage regulation. Because the program/erase biases may be held at a standby level, or at substantially the same active level, time and power can be saved in allowing such biases to settle to the correct levels as part of the resumed write operation.

Figure 18:
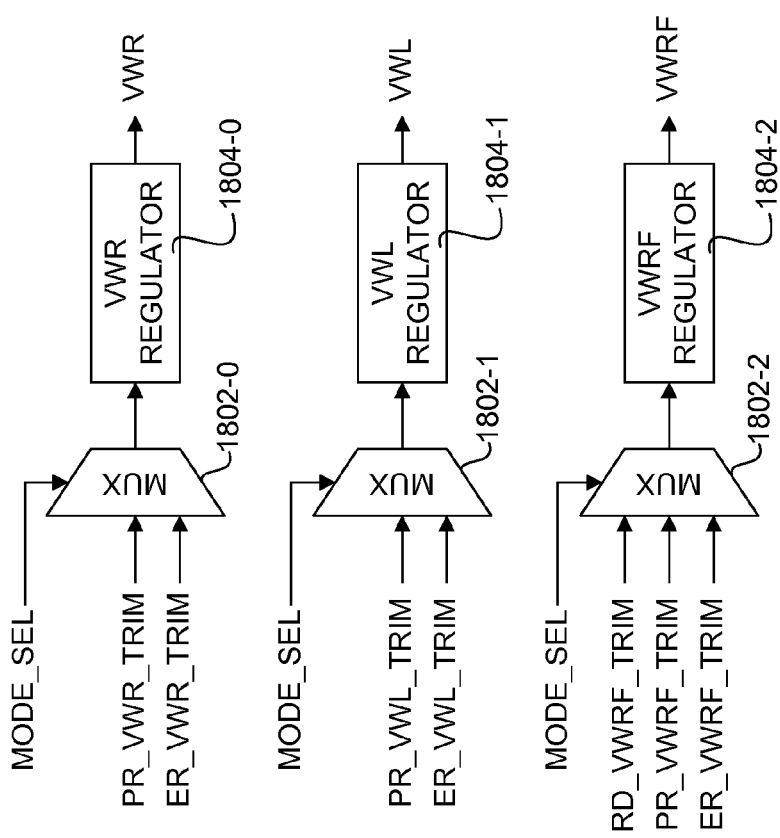
FIG. 18 is a schematic block diagram of an example regulator structure, in accordance with embodiments of the present invention.

Referring now to FIG. 18, shown is a schematic block diagram of an example regulator structure that supports partial pausing, in accordance with embodiments of the present invention. For example, regulator structure 1800 can be included in analog voltage and bias circuits 1710. In this particular arrangement, the VWR (write voltage for right plane) and VWL (write voltage for left plane) regulators may be used only for program/erase operations, while the VWRF (write voltage/read voltage) regulator can be used for both read and program/erase operations. As will be discussed in more detail below, memory array 1708 can be arranged into two blocks or planes, such as where a write operation to the left array plane can be paused to accommodate a read operation from the right array plane, or vice versa.

As shown, mode selection signals (e.g., derived from command decoder 120 of FIG. 1) can be used to select the proper erase, program, or read operation bias voltage trim control signals for the given regulators. Trim control signals for the right array plane (e.g., PR_VWR_TRIM and ER_VWR_TRIM) can be selected via multiplexer 1802-0 based on mode selection signals, and provided to VWR regulator 1804-0 to generate bias voltage VWR. Similarly, trim control signals for the left array plane (e.g., PR_VWL_TRIM and ER_VWL_TRIM) can be selected via multiplexer 1802-1 based on mode selection signals, and provided to VWL regulator 1804-1 to generate bias voltage VWL. Also, trim control signals (e.g., RD_VWRF_TRIM, PR_VWRF_TRIM, and ER_VWRF_TRIM) can be selected via multiplexer 1802-2 based on mode selection signals, and provided to VWRF regulator 1804-2 to generate bias voltage VWRF. VWRF regulator 1804-2 can be modified in order to switch voltages in time for a transition from a program/erase operation to a read operation, such as when a partial pause is applied to the write operation. In some cases where this transition time is insufficient, two VWRF regulators can be included, whereby one is dedicated for program/erase operations, and the other is dedicated for read operations.

Figure 19:
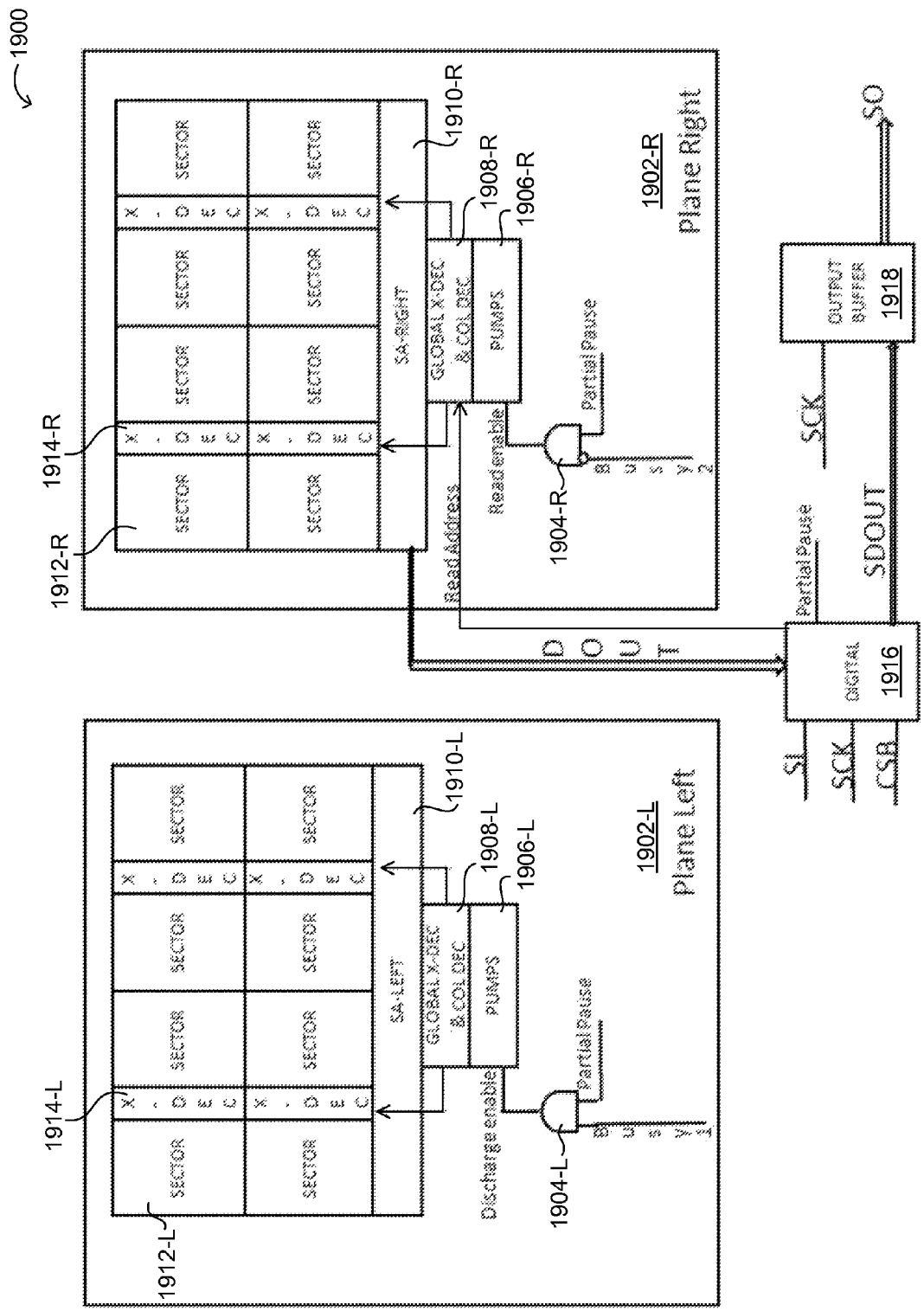
FIG. 19 is a schematic block diagram of an example flash memory device with a concurrent read structure, in accordance with embodiments of the present invention.

Referring now to FIG. 19, shown is a schematic block diagram 1900 of an example flash memory device with a concurrent read structure, in accordance with embodiments of the present invention. Memory array 1708 can be organized as two separate blocks or planes, whereby a write operation that occurs in one of the planes can be interrupted by a read operation to the other plane. In this particular example, plane 1902-L may have a write operation that is partially paused or auto-suspended in response to detection of a read command directed to plane 1902-R. Thus, read out control and data circuitry can include digital logic 1916 that can receive data output from array plane 1902-R, and may be output from the memory device via output buffer 1908.

Any suitable size and structure of the division of the array portions into array planes/zones, as well as any number of planes/zones, as described herein can be supported in particular embodiments. For example, one or more registers can be employed to indicate whether a given sector or block of array sectors 1912 is to be included in one plane (e.g., 1902-L) or another plane (e.g., 1902-R), such as from a total of N (e.g., 2, 3, 4, etc.) planes, as may also be specified in the register(s). In this example, memory array 1708 can be divided into two planes of equal sizes (e.g., 8 sectors each); however, in other cases the two planes can be of different or unequal sizes and/or ratios (e.g., $\frac{1}{16}$, $\frac{1}{8}$, $\frac{1}{4}$, etc.), and/or more than two planes can be configured. Example array plane 1902-L can include logic circuit 1904-L, which may provide a discharge or quiescent state control enable signal to pumps 1906-L. For example, pumps 1906-L (e.g., including regulators 1804) can be placed into such discharge or standby/quiescent state control in response to activation of the partial pause control signal, such as when a write operation to array plane 1902-L is interrupted by a read operation to array plane 1902-R.

Array plane 1902-L can also include global X-decoders and column decoders 1908-L, sense amplifiers 1910-L, memory cell sectors or sub-array blocks 1912-L, and local X-decoders 1914-L. Similarly, array plane 1902-R can include logic circuit 1904-R, which may provide a read enable signal to pumps 1906-R. For example, pumps 1906-R (e.g., including regulators 1804) can be activated for a read operation in response to the read enable control signal, such as when a write operation to array plane 1902-L is interrupted by a read command directed to array plane 1902-R. Array plane 1902-R can also include global X-decoders and column decoders 1908-R, sense amplifiers 1910-R, memory cell sectors or sub-array blocks 1912-R, and local X-decoders 1914-R.

Partial pause control implementation can include a finite state machine (FSM), and in particular may include digital logic configured to control the operating state of the memory device according to the FSM. If the FSM is already in an idle state, then the pause trigger to indicate that a write operation is to be at least partially paused may have no effect. However, if the state machine is in an active state, then the pause trigger can cause the FSM to move to a rapid save and sleep state. In the save state, the current state of the FSM (e.g., just prior to the trigger) can be stored, along with other register contents. The FSM can also change the control/enable lines (e.g., bias control signals) to indicate to the bias circuits (e.g., 1710) to stop current operation, and to return to a quiescent or standby state. For example, this can include VWR regulator 1804-0, VWL regulator 1804-1, VWRF regulator 1804-2, and/or other bias enable signals (e.g., ENES/ENPS). In some cases, such as in CBRAM-based NVM devices, the voltages that are the slowest to return to a quiescent state can include the anode voltage during the program operation. However, because the read block (e.g., 1902-R) may physically be different from the write block (e.g., 1902-L), the write block anode voltage (e.g., via pumps 1906-L) can be allowed to slowly discharge even as sensing (e.g., via 1910-R) from the read block occurs.

If the SPI command decoder (e.g., including digital logic 1916) determines that the detected command is a read command, then the read circuits can be activated (e.g., via logic circuits 1904-R to generate a read enable signal) to sense data from the array, such as from a different block (e.g., 1902-R) that the one (e.g., 1902-L) in which a write operation is ongoing. Since the blocks or planes being read from and written to may be different, the write block biases reaching the quiescent state prior to the beginning of the read block operation is less of a concern. Once the read operation is completed and the CS signal is inactive high, this low-to-high transition trigger can be used to trigger a restart to the FSM. This restart signaling can then use the saved registers to reload the control registers, and to return to the correct point in the FSM to continue operation as to the previously paused write operation (e.g., in block/plane 1902-L).

Depending on the particular implementation, the write operation can be stepped back to a distinct/predetermined "restart" point, or the write operation may be resumed from the left-off point. For a read operation that is in fact a write verify operation, the bit line latches in the write circuitry may remain unchanged by the read operation, and/or separate sense amplifiers can be used for the read operation, which is the case when the read operation is from a different block/plane than that of the write operation. Since in this case the bit line latches inside the write circuitry may be substantially unaffected by the read operation, restarting from the paused point can be accommodated. In some situations, there may be an initialization time whereby the various regulators (e.g., regulators 1804) are switched on, and a predetermined time may elapse for the suitable biases (e.g., VWL) to stabilize prior to continuation of the previously paused write operation.

In some cases, if the user continuously interrupts a write operation with read commands, the FSM may enter a thrashing state whereby it Pauses-Stalls-Restarts-InitRestarts, then again Pauses-Stalls-Restarts-InitRestarts, and never progresses out of the InitRestart state with the write operation because of interrupting read operations. Thus, the user may be made aware of the possibility of such a "stuck-at" operation, so that this condition can be avoided. Also, memory core array 1708 may have two planes (e.g., 1902-L and 1902-R), and each plane may have its own set of sense amplifiers (e.g., 1910) and global X decoders (e.g., 1908). Each plane may also have its own pumps 1906 (e.g., VR pump, VX pump, etc.) to allow for faster discharge circuits of relatively high voltages, and/or quiescent state maintenance of high-voltage levels when that particular plane 1902 has a partially paused write operation.

The interface (e.g., a serial interface) can accept and decode a predetermined read command that triggers the partial pause or auto-suspend operation. While the microcontroller can initiate suspension of a current program or erase operation, the read state machine can start reading data from the core (e.g., plane 1902-R) and sending data to the output (e.g., via output buffer 1918). The content of internal addresses, attempt counter, and/or voltage regulation (e.g., DAC) levels, and phase can be stored, and appropriate pumps may be discharged or maintained in a quiescent/standby high-voltage output state. Some minimum time in a concurrent read operation may be included to allow time to store information and discharge or otherwise appropriately control pump/regulator operation. To avoid a case of not completing a busy (e.g., write) command if a user continuously enters and then exits a partial pause, a minimum program/erase pulse time for a resumed write operation may be included such that a subsequent new read command may not start until the minimum program/erase pulse time has elapsed. This minimum pulse requirement may thus add latency to the concurrent read command, or a specification of a minimum time between two consecutive partial pause operations can be included, as another example. Also, digital logic can include a separate byte counter for read operations that may be shared between read and write operations.

In one embodiment, a method of controlling an NVM device, can include: (i) receiving, by an interface, a write command from a host; (ii) beginning execution of a write operation on a first array plane of a memory array in response to the write command, where the memory array includes a plurality of NVM cells arranged in a plurality of array planes; (iii) receiving, by the interface, a read command from the host; (iv) suspending the write operation in response to detection of the read command during execution of the write operation; (v) beginning execution of a read operation on a second array plane in response to the read command; and (vi) resuming the write operation after the read operation has at least partially been executed.

Figure 20:
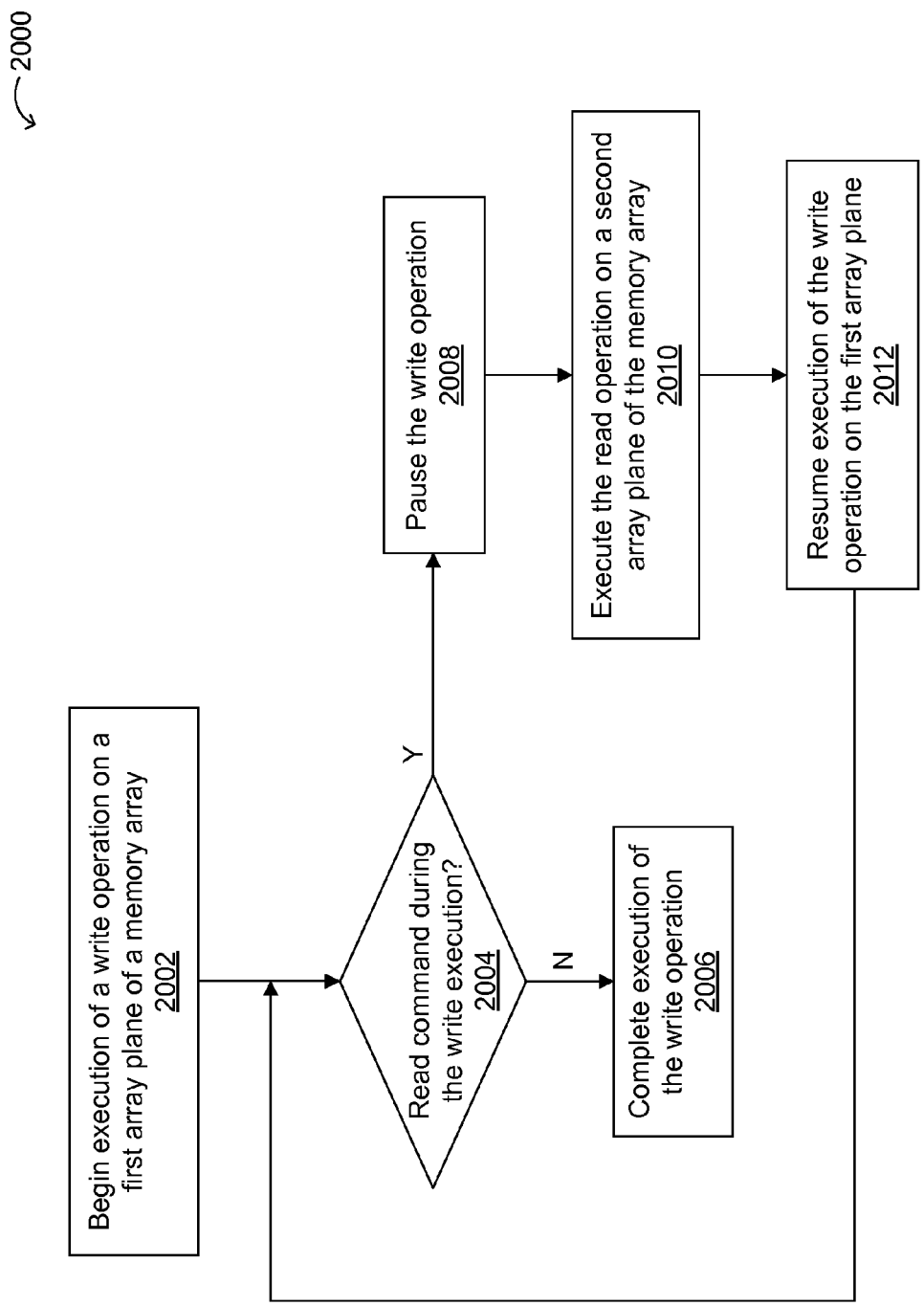
FIG. 20 is a flow diagram of an example method of controlling a memory device with a concurrent read structure, in accordance with embodiments of the present invention.

Referring now to FIG. 20, shown is a flow diagram of an example method 2000 of controlling a memory device with a concurrent read structure, in accordance with embodiments of the present invention. At 2002, execution of a write operation on a first array plane (e.g., of a plurality of array planes) of a memory array can begin. For example, the write operation can be in response to a previously issued write command can begin, and the write operation can include a program or erase pulse applied to array plane 1902-L. If at 2004 there is no read command issued during execution of this write operation, then the write operation can complete at 2006. However, if at 2004 there is a read command detected during the write operation, a partial pause or auto-suspend operation can effectively pause the write operation at 2008.

As discussed above, the partial pause can include saving a state of the write operation, discharging or maintaining (e.g., in a quiescent or standby state) voltage regulation values for the write operation, maintaining other write circuitry for the given array plane, as well as any other suitable functions, in order to allow for a subsequent resumption of the write operation. At 2010, the read operation can be executed on a second array plane (e.g., 1902-R) of the memory array. Once the read operation has completed, or if the read operation is far enough along in the process so as to not be disturbed by noise due to a resumed write operation, execution of the write operation on the first array plane can be resumed at 2012. Once the write operation is resumed at 2012, the device can return to 2004 whereby the device may be ready for another read command (if issued), which can be detected during execution of the (resumed) write operation. In this way, particular embodiments can accommodate concurrent read and write operations in a non-volatile memory device, and including devices with serial interfaces.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A non-volatile memory (NVM) device, comprising:
   a) an interface configured to receive write and read commands from a host;
   b) a memory array comprising a plurality of NVM cells arranged in a plurality of array planes;
   c) a memory controller configured to execute a write operation on a first of the plurality of array planes in response to a write command, and to execute a read operation on a second of the plurality of array planes in response to a read command, wherein the memory controller is configured to suspend the write operation in response to detection of the read command during execution of the write operation, and wherein the memory controller is configured to resume the write operation during execution of the read operation on the memory array; and
   d) a regulator circuit configured to supply a bias voltage for the write operation, wherein the read command comprises a time slot to allow capture of a state of the write operation, and to transition the regulator circuit to a standby state, in order to suspend the write operation.

2. The NVM device of claim 1, further comprising a write address bus coupled between the memory controller and the memory array, and being configured to provide an address for the write operation on the first array plane.

3. The NVM device of claim 2, further comprising a read address bus coupled between the memory controller and the memory array, and being configured to provide an address for the read operation on the second array plane.

4. The NVM device of claim 1, wherein the read operation on the memory array is only during access of the memory array.

5. The NVM device of claim 1, wherein the detection of the read command comprises detection of a transition of a chip select signal in the interface during the execution of the write operation in order to speculatively determine the read command to initiate suspension of the write operation.

6. The NVM device of claim 1, wherein the transition of the regulator circuit to the standby state comprises reducing a pumping frequency for generation of the bias voltage for the write operation.

7. The NVM device of claim 1, wherein the transition of the regulator circuit to the standby state comprises discharging the bias voltage for the write operation.

8. The NVM device of claim 1, further comprising a register that stores an assignment of the plurality of NVM cells to the plurality of array planes.

9. The NVM device of claim 1, further comprising a progress counter configured to measure progress in completing the write operation that is suspended.

10. The NVM device of claim 9, wherein the progress in completing the write operation is measured by counting how many bytes have been written.

11. The NVM device of claim 9, wherein the progress in completing the write operation is measured by counting a number of write pulses.

12. The NVM device of claim 9, wherein the progress in completing the write operation is measured by counting a number of write sub-operations.

13. The NVM device of claim 1, wherein the memory controller is configured to resume the write operation when the read operation has at least partially been executed such that noise from the resumed write operation does not disturb the read operation that is presently accessing the memory array.

14. A method of controlling a non-volatile memory (NVM) device, the method comprising:
   a) receiving, by an interface, a write command from a host;
   b) beginning execution of a write operation on a first array plane of a memory array in response to the write command, wherein the memory array comprises a plurality of NVM cells arranged in a plurality of array planes;
   c) supplying, by a regulator circuit, a bias voltage for the write operation;
   d) receiving, by the interface, a read command from the host;
   e) suspending the write operation in response to detection of the read command during execution of the write operation, wherein the read command comprises a time slot to allow capture of a state of the write operation, and to transition the regulator circuit to a standby state, in order to suspend the write operation;
   f) beginning execution of a read operation on a second of the plurality of array planes in response to the read command; and
   g) resuming the write operation during execution of the read operation on the memory array.

15. The method of claim 14, further comprising storing, by a register, an assignment of the plurality of NVM cells to the plurality of array planes.

16. The method of claim 14, further comprising measuring, by a progress counter, progress in completing the write operation.

17. The method of claim 16, wherein the progress in completing the write operation is measured by counting a number of write pulses.

18. The method of claim 14, wherein the detection of the read command comprises detection of a transition of a chip select signal in the interface during the execution of the write operation in order to speculatively determine the read command to initiate suspension of the write operation.

19. The method of claim 14, wherein the transition of the regulator circuit to the standby state comprises discharging the bias voltage for the write operation.

20. The method of claim 14, wherein the transition of the regulator circuit to the standby state comprises reducing a pumping frequency for generation of the bias voltage for the write operation.

* * * * *